United States Patent [19]

Butler

[11] Patent Number: 5,087,889
[45] Date of Patent: Feb. 11, 1992

[54] AREA EFFICIENT CASCODE DRIVER CIRCUIT

[75] Inventor: James R. Butler, San Jose, Calif.

[73] Assignee: Analog Devices, Inc., Norwood, Mass.

[21] Appl. No.: 658,965

[22] Filed: Feb. 20, 1991

[51] Int. Cl.$^5$ ............................................. H03F 3/45
[52] U.S. Cl. ................................. 330/253; 330/277; 307/304; 307/571
[58] Field of Search ............... 330/253, 277, 311, 261, 330/257, 258; 307/296.7, 304, 571

[56] References Cited

U.S. PATENT DOCUMENTS

| | | | |
|---|---|---|---|
| 4,538,115 | 8/1985 | Butler | 330/253 |
| 4,893,090 | 1/1990 | Boudewijns | 330/253 |
| 4,897,612 | 1/1990 | Carroll | 330/253 |

*Primary Examiner*—Eugene R. LaRoche
*Assistant Examiner*—Tan Dinh
*Attorney, Agent, or Firm*—Koppel & Jacobs

[57] ABSTRACT

A JFET differential amplifier stage in which the gate-drain voltage of each input JFET is kept at least as great as the pinchoff voltage ($V_p$), but preferably close to $V_p$ so as to reduce the effects of impact ionization and generation currents on the amplifier's input bias current. The input JFETs are cascoded with another pair of JFETs, and the gate-source circuits for the JFETs of each branch are connected in series with the gate-source circuit of an additional JFET between the gates and drains of the input JFETs. The additional JFET is supplied with a current that is substantially less than $I_{DSS}$, and thus develops a significant portion of the necessary gate-drain voltages for the input JFETs. This enables a significant net reduction in the chip surface area occupied by the stage.

15 Claims, 1 Drawing Sheet

AREA EFFICIENT CASCODE DRIVER CIRCUIT

BACKGROUND OF THE INVENTION

1. Field of the Invention

This invention relates to different amplifier circuits, and more particularly to differential amplifier circuits employing junction field effect transistors (JFETs) as the differential sensing elements.

2. Description of the Related Art

It is generally desirable to reduce input bias currents in numerous types of electrical circuits. In differential amplifiers which employ JFETs as the differential elements, input bias currents may be attributed to four principal factors:

(1) Impact ionization currents resulting from avalanche multiplication;

(2) Generation currents formed within the space charge region due to generation-recombination centers;

(3) Epitaxial-to-substrate junction leakage currents, for circuits in which junction isolation rather than dielectric isolation is used; and (4) Diffusion currents resulting from electron-hole pairs generated outside of the space charge region diffusing into the space charge region.

Efforts to reduce the input bias current have previously focused on reducing the epitaxial-substrate junction leakage current by the introduction of various compensating currents. These efforts have not addressed the effect of impact ionization current, which can be quite significant once JFETs are operated at high currents and with large gate-drain voltages.

It is normally desirable to operate the JFETs in the saturated region, where they exhibit a high output impedance. Saturation is reached when the gate-drain voltage exceeds the device's pinchoff voltage ($V_p$) In this mode a region of the JFET channel is pinched off, and the drain current that continues to flow is substantially independent of variations in the gate-drain voltage. To assure that the JFETs remain saturated their gate-drain voltages may be held at a level much greater than $V_p$, but this substantially increases the impact ionization current contribution to input bias current.

A different approach to reducing the input bias current of a JFET differential amplifier stage, in which the gate-drain voltages of the JFETs are set at a level at which the effect of impact ionization current on the total input bias current is quite small, is disclosed in U.S. Pat. No. 4,538,115, issued Aug. 27, 1985 to the present inventor and assigned to Precision Monolithics, Inc. In this patent, a pair of input JFETs are connected in a differential stage and supplied with sufficient current to establish their gate-source voltages at less than $V_p$. A second pair of JFETs are cascoded with the input pair, with their gates held at substantially the same voltage as the source voltages of the input pair. The JFETs are each supplied with a current approximately equal to 0.25 $I_{DSS}$ (defined as the drain current that will flow when the gate and source of a JFET are tied together), thereby utilizing a known JFET relationship to establish a gate-source voltage for each of the input and cascoded JFETs approximately equal to 0.5 $V_p$. The cumulative gate-source voltages of the input and cascoded JFETs produce gate-drain voltages for the input pair approximately equal to $V_p$, the minimum voltage necessary to keep the input JFETs saturated.

In the preferred embodiment, an additional pair of JFETs are added to buffer the input JFETs from large capacitances that can develop at the gates of the cascoded JFETs. The gate and source of one of the additional JFETs are connected together to a positive voltage bus, forcing it to carry a current equal to $I_{DSS}$. This current is delivered to the source-drain circuit of the other additional JFET, which accordingly also exhibits a substantially zero source-gate voltage. While the source-gate voltage of the latter JFET is connected in series between the sources of the input JFETs and the gates of the cascoded JFETs, deliberately holding its source-gate voltage at a substantially zero level assured that the buffered transistors would not interfere with the circuit's AC operation.

While the approach taken in this patent is effective in reducing the circuit's input bias current, the cascoded JFETs have to be relatively large for their gate-source voltages to properly bias the input JFETs. This reduces the area available on the chip for other circuitry. In addition, the input JFETs themselves are relatively large.

SUMMARY OF THE INVENTION

The present invention seeks to preserve the reduction in input bias current achieved with U.S. Pat. No. 4,538,115, and yet make a significant reduction in the net area required for its various transistors.

This goal is achieved by a circuit that operates contrary to the prior patent, in that a significant voltage is deliberately developed across the gate-source circuit of the additional JFET in series with the input and cascoded JFETs, thus causing the additional JFET to alter the circuit's AC operation. For each branch of the amplifier stage, the voltage necessary to impose $V_p$ across the input JFET's gate-drain circuit is now developed across three JFETs (the input, cascoded and additional JFETs), not just across two JFETs (the input and cascoded devices). This permits the sizes of both the cascoded and inputed JFETs to be significantly reduced.

In the preferred embodiment, a gate-source voltage of approximately 0.5 $V_p$ is developed across the additional buffer JFET. This is accomplished by increasing the size of that JFET by a factor of 4, thereby reducing its current to 0.25 $I_{DSS}$. While the area required for the buffer JFET is increased, that device is still much smaller than the input and cascoded JFETs, and its increased size is much more than compensated by the reduction in the input and cascoded JFET scalings.

These and other features and advantages of the invention will be apparent to those skilled in the art from the following detailed description, taken together with the accompanying drawings, in which:

DETAILED DESCRIPTION OF A PREFERRED EMBODIMENT

Figure 1:
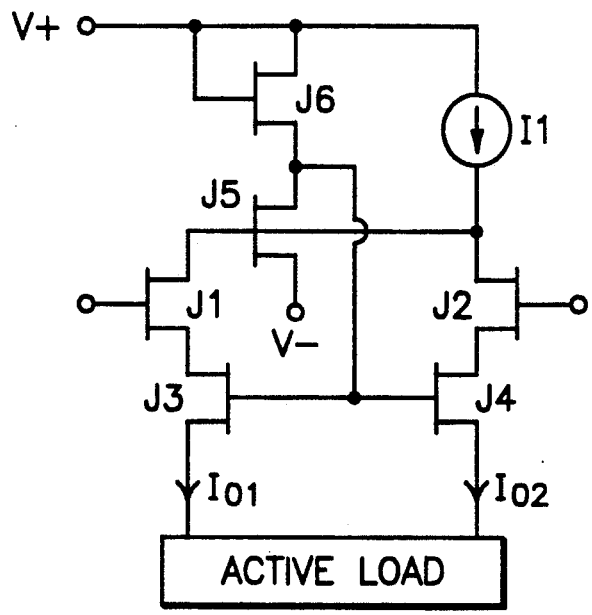
FIG. 1 is a schematic diagram of a preferred embodiment of the invention.

A preferred circuit for the invention is shown in FIG. 1. A pair of depletion-type JFETs J1 and J2 are connected in a differential amplifier stage with their sources tied together and their gates adapted to receive bias voltages. A current source I1 is connected to a positive voltage bus V+, typically 15 volts, and supplies current to the common source connection of J1 and J2. In normal operation the current from I1 is divided between J1 and J2 in accordance with the relative bias voltages applied to their gates.

An additional pair of JFETs J3 and J4 are cascoded (i.e., connected in series) with J1 and J2, the sources of J3 and J4 being connected to the drains of J1 and J2, respectively. (The designation of one JFET terminal as a "source" and another as a "drain" is arbitrary; since the devices, structures are generally symmetrical, these labels could be reversed without changing the circuit operation.) The drains of J3 and J4 carry output currents $I_{01}$ and $I_{02}$, respectively, to an active load circuit 2. The active load circuit may be of the type disclosed in U.S. Pat. No. 4,687,974, issued Aug. 18, 1987 in the name of the present inventor and assigned to Precision Monolithics, Inc., or some other load circuit such as another amplifier stage that employs active circuit elements. J1 and J2 are preferably matched with each other, as are J3 and J4, although the circuit parameters can be adjusted to account for non-matching transistors.

Additional JFETs J5 and J6 are provided to buffer J1 and J2 from large capacitances that can develop at the gates of J3 and J4, thereby mitigating the effect of such capacitances on the amplifier's AC operation. The gate-source circuit of J5 is connected in series between the J1, J2 gate-source circuits and the J3, J4 gate-source circuits, respectively, while its drain is connected to a negative voltage bus V−, typically −15 volts. The gate and source of J6 are connected together to V+, while its drain is connected to the source of J5. Since the gate and source of J6 are shorted together, by definition J6 must carry a current equal to $I_{DSS}$.

Taking the left hand branch of the FIG. 1 amplifier circuit, it can be seen that a series circuit was formed between the gate and drain of J1 by the gate-source circuits of J1, J5 and J3. Thus, the gate-drain voltage of J1 is equal to the cumulative gate-source voltages of these three JFETs. Similarly, the gate-drain voltage of J2 is established by the cumulative voltages across the gate-source circuits of J2, J5 and J4.

In the prior circuit of U.S. Pat. No. 4,538,115, J5 and J6 are equal in size, so that the $I_{DSS}$ current from J6 forces the gate-source voltage of J5 to a zero volt level. With the present invention, on the other hand, J5 is deliberately scaled larger than J6, so that the current density through J5 will be less than $I_{DSS}$, thus setting its gate-source voltage at a non-zero level. In the preferred embodiment the width of J5 is 4 times that of J6, resulting in a current through J5 of 0.25 $I_{DSS}$. In accordance with known JFET characteristics, at this current level the gate-source voltage of J5 will be equal to approximately 0.5 $V_p$, rather than zero. Other relative scalings between J5 and J6 could also be used to establish a different gate-source voltage for J5.

Since J5 is now contributing a substantial portion of the necessary $V_p$ for the gate-drain circuits of J1 and J2, the contributions from the gate-source circuits of J1–J4 can be correspondingly reduced. This is accomplished by reducing the widths of J3 and J4, and preferably also of J1 and J2 (the sizes of J1 and J2 are determined primarily by their desired frequency response, noise and input referred offset voltage levels, but the invention allows their sizes to be reduced if permitted by these other factors). Reducing the sizes of J3 and J4, and also of J1 and J2 if desired, increases the current density through the reduced devices and thus lowers their gate-source voltages. This is permissible, since the non-zero gate-source voltage of J5 compensates for the reduction in the gate-source voltages of J1–J4.

Operation with the gate-drain voltages of J1 and J2 at exactly $V_p$ is the optimum condition for minimizing input bias current while keeping the JFETs saturated. The current for each transistor should be kept at a level no greater than that necessary to achieve this gate-drain voltage. Lesser current levels may be employed to compensate for processing variation and transients to assure that the transistors remain saturated, but if the current source I1 is reduced to a level at which the gate-drain voltages of J1 and J2 are significantly greater than $V_p$, the increase in input bias current can be substantial. This is because the impact ionization current through these JFETs varies exponentially with the applied reverse bias voltage; the relatively low gate-drain voltages will assure a low level of impact ionization current, and accordingly a lower input bias current. The generation current will also be reduced, although not by as great a degree as the impact ionization current, thereby further reducing the total input bias current.

In a particular implementation, the lengths of J1–J4 were 12 microns, while the lengths of J5 and J6 were 15 microns. The width:length ratio for J3 and J4 was 107, representing an approximately 50% reduction from a corresponding circuit constructed under the teachings of U.S. Pat. No. 4,538,115. The ratio for J1 and J2, which in the former circuit had been equal to J3 and J4, was also reduced but by a somewhat lesser amount, to 113. The width:length ratio for J6 remained at 4.25, the same as in the prior circuit, while the ratio for J5 increased to 17 from its prior value of 4.25.

Figure 2:
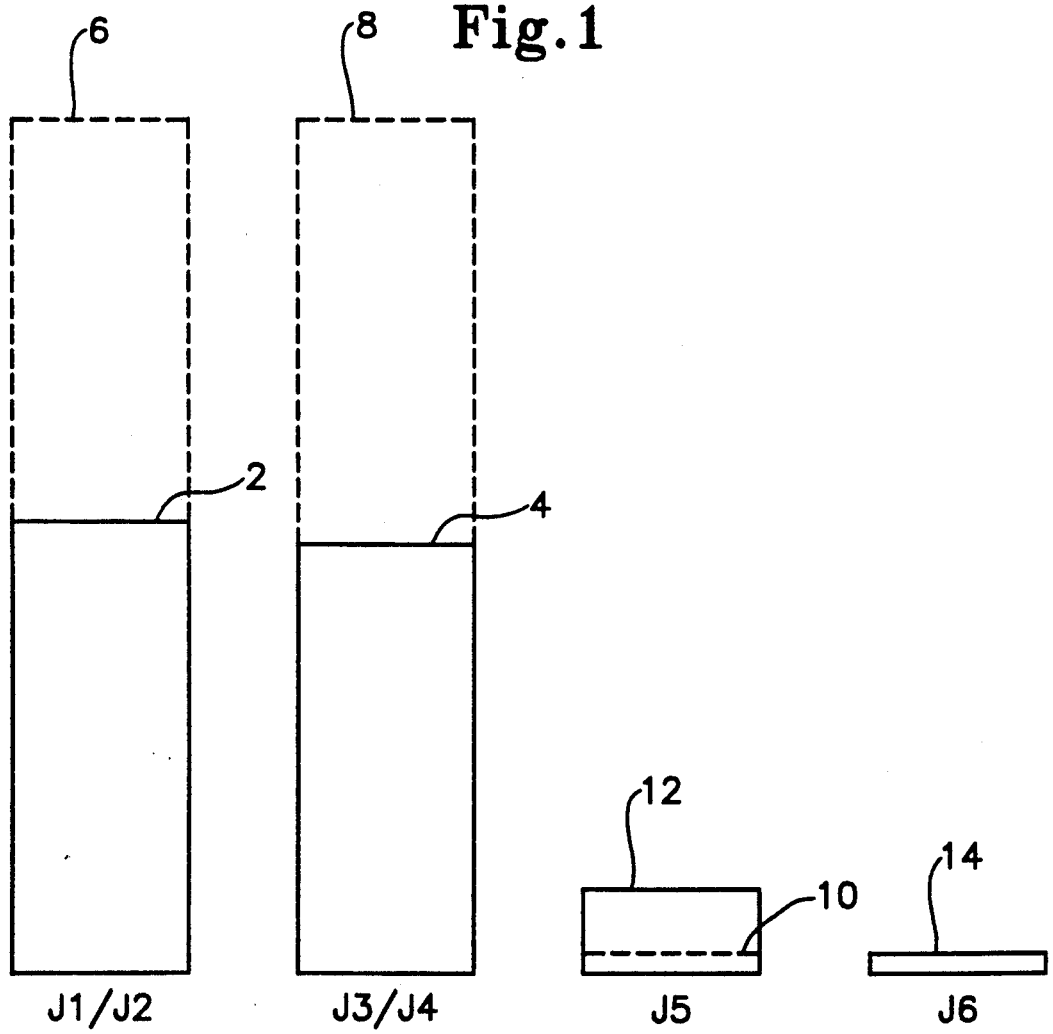
FIG. 2 is a chart illustrating the net reduction in JFET area that is obtainable with the invention.

The changes in chip surface area occupied by the various JFETs are illustrated in FIG. 2. The device areas for the above implementation of the present invention are indicated by solid line bars, while the device areas for the corresponding circuit under U.S. Pat. No. 4,538,115 are indicated by dashed lines. It can be seen that the areas 2 occupied by J1 and J2 are somewhat greater than the areas 4 occupied by J3 and J4, but both are substantially less than the corresponding areas 6 and 8 in the prior circuit. The area 10 occupied by J5 in the prior circuit has increased fourfold to area 12 in the present circuit, whereas the area 14 previously occupied by J6 remains unchanged.

The percentage increase in area for J5 is greater than the percentage reduction in area for J1–J4. However, since J5 is much smaller than any of J1–J4 in either the prior or the current circuit, there is a substantial net reduction in the total area occupied by the circuit. The fourfold increase in the size of J5 reduces the current density which it carries to 0.25 $I_{DSS}$, so that the gate-source voltage for J5 increases from 0 in the prior circuit to 0.5 $V_p$ in this implementation. The sizes of J1–J4 could be further reduced by again increasing the scaling of J5, so J5 carries even more of the minimum $V_p$ which is applied across the gate-drain circuits of J1 and J2. However, J1–J4 should not be scaled down beyond the point where their drain currents exceed $I_{DSS}$.

While particular embodiments of the invention have been shown and described, alternate embodiments and variations will occur to those skilled in the art. Accordingly, it is intended that the invention be limited only in terms of the appended claims.

I claim:

1. A JFET (junction field effect transistor) differential amplifier stage, comprising:

first and second JFETs connected in a differential amplifier stage with their sources connected together, and their gates adapted to receive respective input voltage signals, a first current source connected to supply current to the JFETs, the current magnitude supplied by said first current source being great enough to establish gate-source voltages for the two JFETs which are less than their pinchoff voltages ($V_p$), third and fourth JFETs cascoded respectively with the first and second JFETs, a fifth JFET having its gate-source circuit connected between the gate-source circuits of the first and third JFETs and of the second and fourth JFETs, and a second current source connected to supply a source current to the fifth JFET which is substantially less than its $I_{DSS}$, where $I_{DSS}$ is the drain current that flow in said fifth JFET when its gate and source are tied together, thereby establishing a non-zero gate-source voltage for said fifth JFET and setting the source voltages of said first and second JFETs substantially unequal to the gate voltage of said third and fourth JFETs, whereby said fifth JFET alters the AC (alternating current) operation of said differential amplifier stage, said third JFET being sized so that the sum of its gate-source voltage and the gate-source voltage of said fifth transistor is at least as great as the differential between the gate-source voltage and $V_p$ for said first JFET, and said fourth JFET being sized so that the sum of its gate-source voltage and the gate-source voltage of said fifth transistor is at least as great as the differential between the gate-source voltage and $V_p$ for said second JFET, whereby the gate-drain voltages of the first and second JFETs are maintained at at least $V_p$ to keep them saturated with a high output impedance.

2. A JFET (junction field effect transistor) differential amplifier stage, comprising:

first and second JFETs connected in a differential amplifier stage with their sources connected together, and their gates adapted to receive respective input voltage signals, a first current source connected to supply current to the JFETs, the current magnitude supplied by said first current source being great enough to establish gate-source voltages for the two JFETs which are less than their pinchoff voltages ($V_p$), third and fourth JFETs cascoded respectively with the first and second JFETs, a fifth JFET having its gate-source circuit connected between the gate-source circuits of the first and third JFETs and of the second and fourth JFETs, and a second current source connected to supply a source current to the fifth JFET which is substantially less than its $I_{DSS}$, where $I_{DSS}$ is the drain current that flows in said fifth JFET when its gate and source are tied together, thereby establishing a non-zero gate-source voltage for said fifth JFET, said third JFET being sized so that the sum of its gate-source voltage and the gate-source voltage of said fifth transistor is at least as great as the differential between the gate-source voltage and $V_p$ for said first JFET, and said fourth JFET being sized so that the sum of its gate-source voltage and the gate-source voltage of said fifth transistor is at least as great as the differential between the gate-source voltage and $V_p$ for said second JFET, whereby the gate-drain voltages of the first and second JFETs are maintained at at least $V_p$ to keep them saturated with a high output impedance, wherein said second current source comprises a sixth JFET having its gate and source connected to a voltage supply bus and its drain connected to the source of said fifth JFET, said sixth JFET being scaled substantially smaller than said fifth JFET so that the current through said sixth JFET is $I_{DSS}$ and the current through said fifth JFET is substantially less than $I_{DSS}$.

3. The JFET differential amplifier stage of claim 2, said sixth JFET being scaled approximately 0.25 the size of said fifth JFET so that the fifth JFET's gate-source voltage is approximately 0.5 $V_p$.

4. A JFET (junction field effect transistor) differential amplifier stage, comprising:

first and second JFETs connected in a differential amplifier stage with their sources connected together, and their gates adapted to receive respective input voltage signals, a first current source connected to supply current to the JFETs, the current magnitude supplied by said first current source being great enough to establish gate-source voltages for the two JFETs which are less than their pinchoff voltages ($V_p$), third and fourth JFETs cascoded respectively with the first and second JFETs, a fifth JFET having its gate-source circuit connected between the gate-source circuits of the first and third JFETs and of the second and fourth JFETs, and a second current source connected to supply a source current to the fifth JFET which is substantially less than its $I_{DSS}$, where $I_{DSS}$ is the drain current that flows in said fifth JFET when its gate and source are tied together, thereby establishing a non-zero gate-source voltage for said fifth JFET, said third JFET being sized so that the sum of its gate-source voltage and the gate-source voltage of said fifth transistor is at least as great as the differential between the gate-source voltage and $V_p$ for said first JFET, and said fourth JFET being sized so that the sum of its gate-source voltage and the gate-source voltage of said fifth transistor is at least as great as the differential between the gate-source voltage and $V_p$ for said second JFET, whereby the gate-drain voltages of the first and second JFETs are maintained at at least $V_p$ to keep them saturated with a high output impedance.

wherein said fifth JFET is scaled substantially smaller than said first through fourth JFETs.

5. A JFET (junction field effect transistor) differential amplifier stage, comprising:

first and second JFETs connected in a differential amplifier stage with their sources connected together, and their gates adapted to receive respective input voltage signals, third and fourth JFETs cascoded respectively with the first and second JFETs, a first current source connected to supply source current to said first, second, third and fourth JFETs in an amount which is greater than 0.25 $I_{DSS}$ but less than $I_{DSS}$ for each JFET, thereby establishing a gate-source voltage for each JFET that is greater than zero but less than its pinchoff voltage ($V_p$), a fifth JFET having its gate-source circuit connected between the gate-source circuits of the first and third JFETs and of the second and fourth JFETs, and a second current source connected to supply a source current to the fifth JFET which is substantially less than its $I_{DSS}$ to establish gate-drain voltages for said first and second JFETs that are at least equal to $V_p$ to keep said first and second JFETs saturated, and to set the source voltages of said first and second JFETs substantially unequal to the gate voltages of said third and fourth JFETs, whereby said fifth JFET alters the AC (alternating current) operation of said differential amplifier stage.

6. A JFET (junction field effect transistor) differential amplifier stage, comprising:

first and second JFETs connected in a differential amplifier stage with their sources connected together, and their gates adapted to receive respective input voltage signals, third and fourth JFETs cascoded respectively with the first and second JFETs, a first current source connected to supply source current to said first, second, third and fourth JFETs in an amount which is greater than 0.25 $I_{DSS}$ but less than $I_{DSS}$ for each JFET, thereby establishing a gate-source voltage for each JFET that is greater than zero but less than its pinchoff voltage ($V_p$), a fifth JFET having its gate-source circuit connected between the gate-source circuits of the first and third JFETs and of the second and fourth JFETs, and a second current source connected to supply a source current to the fifth JFET which is substantially less than its $I_{DSS}$ to establish gate-drain voltages for said first and second JFETs that are at least equal to $V_p$ to keep said first and second JFETs saturated, wherein said fifth JFET is scaled substantially smaller than said first through fourth JFETs.

7. A JFET (junction field effect transistor) differential amplifier stage, comprising:

first and second JFETs connected in a differential amplifier stage with their sources connected together, and their gates adapted to receive respective input voltage signals, third and fourth JFETs cascoded respectively with the first and second JFETs, a first current source connected to supply source current to said first, second, third and fourth JFETs in an amount which is greater than 0.25 $I_{DSS}$ but less than $I_{DSS}$ for each JFET, thereby establishing a gate-source voltage for each JFET that is greater than zero but less than its pinchoff voltage ($V_p$), a fifth JFET having its gate-source circuit connected between the gate-source circuits of the first and third JFETs and of the second and fourth JFETs, and a second current source connected to supply a source current to the fifth JFET which is substantially less than its $I_{DSS}$ to establish gate-drain voltages for said first and second JFETs that are at least equal to $V_p$ to keep said first and second JFETs saturated, wherein said third and fourth JFETs are scaled smaller than said first and second JFETs so that their gate-source voltages are less than the gate-source voltages of said first and second JFETs in response to the current from said first current source.

8. A JFET (junction field effect transistor) differential amplifier stage, comprising:

first and second JFETs connected in a differential amplifier stage with their sources connected together, and their gates adapted to receive respective input voltage signals, third and fourth JFETs cascoded respectively with the first and second JFETs, a first current source connected to supply source current to said first, second, third and fourth JFETs in an amount which is greater than 0.25 $I_{DSS}$ but less than $I_{DSS}$ for each JFET, thereby establishing a gate-source voltage for each JFET that is greater than zero but less than its pinchoff voltage ($V_p$), a fifth JFET having its gate-source circuit connected between the gate-source circuits of the first and third JFETs and of the second and fourth JFETs, and a second current source connected to supply a source current to the fifth JFET which is substantially less than its $I_{DSS}$ to establish gate-drain voltages for said first and second JFETs that are at least equal to $V_p$ to keep said first and second JFETs saturated, wherein said second current source comprises a sixth JFET having its gate and source connected to a voltage supply bust and its drain connected to the source of said fifth JFET, said sixth JFET being scaled substantially smaller than said fifth JFET, so that the current through said sixth JFET is $I_{DSS}$ and the current through said fifth JFET is substantially less than $I_{DSS}$.

9. The JFET differential amplifier stage of claim 8, said sixth JFET being scaled approximately 0.25 the size of said fifth JFET so that the fifth JFET's gate-source voltage is approximately 0.5 $V_p$.

10. A JFET (junction field effect transistor) differential amplifier stage, comprising:

first and second JFETs connected in a differential amplifier stage with their sources connected together, and their gates adapted to receive respective input voltage signals, third and fourth JFETs cascoded respectively with said first and second JFETs, with the sources of said third and fourth JFETs connected to the drains of said first and second JFETs, respectively, a first current source connected to supply current to said first through fourth JFETs, the current magnitude being sufficient to establish cumulative gate-source voltages for said first and third JFETs, and for said second and fourth JFETs, that are less than the pinchoff voltage ($V_p$) for said first and second JFETs, respectively, and a voltage drop circuit connected in series respectively with said first and third JFETs and said second and fourth JFETs, said voltage drop circuit developing a voltage differential that is additive to said cumulative gate-source voltages to establish gate-drain voltages for said first and second JFETs at least equal to their $V_p$ to keep them in a saturated mode with a high output impedance and to set the source voltages of said first and second JFETs substantially unequal to the gate voltages of said third and fourth JFETs, whereby said fifth JFET alters the AC (alternating current) operation of said differential amplifier stage.

11. The JFET differential amplifier stage of claim 10, said voltage drop means comprising a fifth JFET with its gate-source circuit connected in said series circuit, and a second current source connected to supply a source current to said fifth JFET which is substantially less than its $I_{DSS}$, thereby establishing a non-zero gate-source voltage for said fifth JFET.

12. A JFET (junction field effect transistor) differential amplifier stage comprising:
   first and second JFETs connected in a differential amplifier stage with their soruces connected together, and their gates adapted to receive respective input voltage signals,
   third and fourth JFETs cascoded respectively with said first and second JFETs, with the soruces of said third and fourth JFETs connected to the drains of said first and second JFETs, respectively,
   a first current source connected to supply current to said first through fourth JFETs, the current magnitude being sufficient to establish cumulative gate-source voltages for said first and third JFETs, that are less than the pinchoff voltage ($V_p$) for said first and second JFETs, respectively, and
   a voltage drop circuit connected in series respectively with said first and third JFETs and said second and fourth JFETs, said voltage drop circuit developing a voltage differential that is additive to said cumulative gate-source voltages to establish gate-drain voltages for said first and second JFETs at least equal to their $V_p$ to keep them in a saturated mode with a high output impedance,
   said voltage drop circuit comprising a fifth JFET with its gate-source circuit connected in said series circuit, and a second current source connected to supply a source current to said fifth JFET with is substantially less than its $I_{DSS}$, thereby establishing a non-zero gate-source voltage for said fifth JFET,
   wherein said fifth JFET is scaled substantially smaller than said first through fourth JFETs.

13. A JFET (junction field effect transistor) differential amplifier stage comprising:
   first and second JFETs connected in a differential amplifier stage with their sources connected together, and their gates adapted to receive respective input voltage signals,
   third and fourth JFETs cascoded respectively with said first and second JFETs, with the sources of said third and fourth JFETs connected to the drains of said first and second JFETs, respectively,
   a first current source connected to supply current to said first through fourth JFETs, the current magnitude being sufficient to establish cumulative gate-source voltages for said first and third JFETs, that are less than the pinchoff voltage ($V_p$) for said first and second JFETs, respectively, and
   a voltage drop circuit connected in series respectively with said first and third JFETs and said second and fourth JFETs, said voltage drop circuit developing a voltage differential that is additive to said cumulative gate-source voltages to establish gate-drain voltages for said first and second JFETs at least equal to their $V_p$ to keep them in a saturated mode with a high output impedance,
   said voltage drop circuit comprising a fifth JFET with its gate-source circuit connected in said series circuit, and a second current source connected to supply a source current to said fifth JFET which is substantially less than its $I_{DSS}$, thereby establishing a non-zero gate-source voltage for said fifth JFET,
   wherein said second current source comprises a sixth JFET having its gate and source connected to a voltage supply bus and its drain connected to the source of said fifth JFET, said sixth JFET being scaled substantially smaller than said fifth JFET, so that the current through said sixth JFET is $I_{DSS}$ and the current through said fifth JFET is substantially less than $I_{DSS}$.

14. The JFET differential amplifier stage of claim 13, said sixth JFET being scaled approximately 0.25 the size of said fifth JFET so that the fifth JFET's gate-source voltage is approximately 0.5 $V_p$.

15. A JFET (junction field effect transistor) differential amplifier stage comprising:
   first and second JFETs connected in a differential amplifier stage with their sources connected together, and their gates adapted to receive respective input voltage signals,
   third and fourth JFETs cascoded respectively with said first and second JFETs, with the soruces of said third and fourth JFETs connected to the drains of said first and second JFETs, respectively,
   a first current source connected to supply current to said first through fourth JFETs, the current magnitude being sufficient to establish cumulative gate-source voltages for said first and third JFETs, that are less than the pinchoff voltage ($V_p$) for said first and second JFETs, respectively, and
   a voltage drop circuit connected in series respectively with said first and third JFETs and said second and fourth JFETs, said voltage drop circuit developing a voltage differential that is additive to said cumulate gate-source voltages to establish gate-drain voltages for said first and second JFETs at least equal to their $V_p$ to keep them in a saturated mode with a high output impedance,
   wherein said third and fourth JFETs are scale cd smaller than said first and second JFETs so that their gate-source voltages are less than the gate-source voltages of said first and second JFETs in response to the current from said first current source.

* * * * *